(12) United States Patent
Wang et al.

(10) Patent No.: US 6,534,414 B1
(45) Date of Patent: Mar. 18, 2003

(54) DUAL-MASK ETCH OF DUAL-POLY GATE IN CMOS PROCESSING

(75) Inventors: Kuilong Wang; Tsengyou Syau, both of Portland; Shih-Ked Lee, Hillsboro, all of OR (US); Chuen-Der Lien, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/594,328

(22) Filed: Jun. 14, 2000

(51) Int. Cl.[7] .................................................. H01L 21/302
(52) U.S. Cl. ..................... 438/709; 438/717; 438/719; 438/720; 438/725
(58) Field of Search ................................. 438/709, 717, 438/719, 720, 724, 723, 532, 725

(56) References Cited

U.S. PATENT DOCUMENTS

| | | | |
|---|---|---|---|
| 5,355,010 A | 10/1994 | Fujii et al. | 257/377 |
| 5,863,819 A | 1/1999 | Gonzalez | 438/238 |
| 5,877,535 A | 3/1999 | Matsumoto | 257/369 |
| 5,918,133 A | 6/1999 | Gardner et al. | 438/299 |
| 5,945,724 A | 8/1999 | Parekh et al. | 257/510 |
| 5,985,725 A | 11/1999 | Chou | 438/294 |
| 5,989,962 A | 11/1999 | Holloway et al. | 438/275 |
| 6,010,925 A | 1/2000 | Hsieh | 438/197 |
| 6,010,961 A | 1/2000 | Hu | 438/655 |
| 6,017,784 A | 1/2000 | Ohta et al. | 438/197 |
| 6,107,173 A * | 8/2000 | Han | 438/585 |
| 6,153,534 A * | 11/2000 | Long et al. | 438/745 |
| 6,221,708 B1 * | 4/2001 | Gonzalez et al. | 438/216 |

* cited by examiner

Primary Examiner—Robert Kunemund
Assistant Examiner—Binh X. Tran
(74) Attorney, Agent, or Firm—Marger, Johnson & McCol

(57) ABSTRACT

The invented method involves separately etching the P and N gate features in a dual-poly gate using dual masks, thereby permitting the etching recipes to be tuned to the differentially responsive P and N materials that form the gate. The method involves a) providing a polysilicon layer of a first type over a first region of a semiconductor substrate; b) providing a polysilicon layer of a second type over a second region of the semiconductor substrate; c) depositing a metallic layer overlying the polysilicon layers in the first and second regions; d) depositing an anti-reflective layer overlying the metallic layer in the first and second regions; e) selectively etching the dielectric hard-mask multi-layer film to form a patterned outer hard-mask multi-layer; f) forming a first photoresist pattern overlying the patterned outer hard-mask multi-layer in the first region; g) first etching the metallic layer and the polysilicon layer of the second type to form a stacked gate structure in the second region; h) forming a second photoresist pattern overlying the patterned outer hard-mask multi-layer in the second region; and i) second etching the metallic layer and the polysilicon layer of the first type to form a stacked gate structure in the first region. Preferably, the first photoresist pattern and the second photoresist pattern define a nominal boundary therebetween, with the patterns having a predefined gap therebetween in a region around the boundary. Alternatively, the dual-mask technique is used on a non-hardmask dual-poly film stack and the top dielectric multi-layer film is replaced by an anti-reflection coating (ARC) film.

31 Claims, 3 Drawing Sheets

DUAL-MASK ETCH OF DUAL-POLY GATE IN CMOS PROCESSING

BACKGROUND OF THE INVENTION

1. Field of the Invention

This invention relates to complementary metal-oxide semiconductor (CMOS) manufacturing, and, more particularly, to a dual-polysilicon (dual-poly) gate fabrication method.

2. Description of the Related Art

Dual-poly gate technology is preferred to produce surface channel devices having small critical dimension (CD), e.g. CDs below approximately 0.25 micrometer ($\mu$m). Such surface channel devices have both N-type and P-type material formed separately by masked implants to a common thin film of polysilicon deposited on a substrate. During gate formation by etching, using a single mask for both the N and P features, the N and P materials respond to etching chemistries differently, i.e. the result is differential etching of the materials. This leads to undesirably and often unacceptably different feature profiles and oxide remnant between the P and N regions of the gate.

SUMMARY OF THE INVENTION

The invented method involves separately etching the P and N gate features in a dual-poly gate using dual masks, thereby permitting the etching chemistries to be tuned to the differentially responsive P and N materials that form the gate. The method involves a) providing a polysilicon layer of a first type over a first region of a semiconductor substrate; b) providing a polysilicon layer of a second type over a second region of the semiconductor substrate; c) depositing a metallic layer overlying the polysilicon layers in the first and second regions; d) depositing an anti-reflective layer overlying the metallic layer in the first and second regions; e) selectively etching the dielectric hardmask multi-layer film to form a patterned outer hard-mask multi-layer; f) forming a first photoresist pattern overlying the patterned outer hard-mask multi-layer in the first region; g) first etching the metallic layer and the polysilicon layer of the second type to form a stacked gate structure in the second region; h) forming a second photoresist pattern overlying the patterned outer hard-mask multi-layer in the second region; and i) second etching the metallic layer and the polysilicon layer of the first type to form a stacked gate structure in the first region. Preferably, the first photoresist pattern and the second photoresist pattern define a nominal boundary therebetween, with the patterns having a predefined gap therebetween in a region around the boundary. Alternatively, the dual-mask technique is used on a non-hardmask dual-poly film stack and the top dielectric multi-layer film is replaced by an ARC film.

The foregoing and other objects, features and advantages of the invention will become more readily apparent from the following detailed description of a preferred embodiment which proceeds with reference to the drawings.

DETAILED DESCRIPTION

Figure 1A:
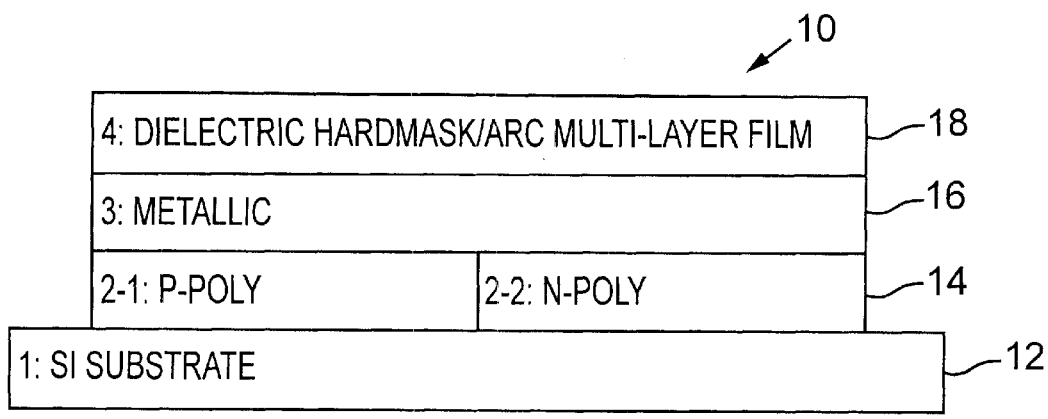
FIGS. 1A through 1E are simplified process phase diagrams of the cross section of the dual-mask process of fabricating a dual-poly gate using a top anti-reflective layer, in accordance with a first embodiment of the invention.

FIGS. 1A through 1E illustrate the process in accordance with the invention by which the dual-mask etch of a film stack is accomplished. FIG. 1A shows film stack at 10 including a silicon (Si) substrate 12 of either P or N type depending as is known on the requirements of the target semiconductor device. A layer immediately above the Si substrate is a dual-poly film 14. The film may be started with a 500–2000 Å amorphous silicon or polysilicon, the former being preferred. The film can be deposited in a furnace, as is conventional, or by advanced chemical vapor deposition (CVD) techniques, as are also conventional. Dual-poly film 14 is implanted with N-type (75 As+ or 31 P+) species for the area where N-type devices are to be fabricated. The P-device area is fully covered with photoresist during the N implantation. The P-device area is similarly implanted. N-type and P-type species implantation is followed by RTA activation.

Another layer 16 optionally overlaying and immediately above dual-poly film 14 is a metallic conducting film such as mono-$SiH_4$ metallic or DCS metallic. Metallic layer 16 typically is approximately 300–1000 Å in thickness. Those of skill in the art will appreciate that metallic layer 16 is not required of all applications. Thus, the dual-gate film can be a bi-layer polycide film or a poly-only film, within the spirit and scope of the invention.

A dielectric multi-layer film 18, which may be referred to herein as the top layer, overlays optional metallic layer 16 (or, in the case that metallic layer 16 is not present, film 18 overlays dual-poly film 14 layer). The structure of multi-layer film 18 will be described in more detail by reference immediately below to FIG. 2.

Figure 2:
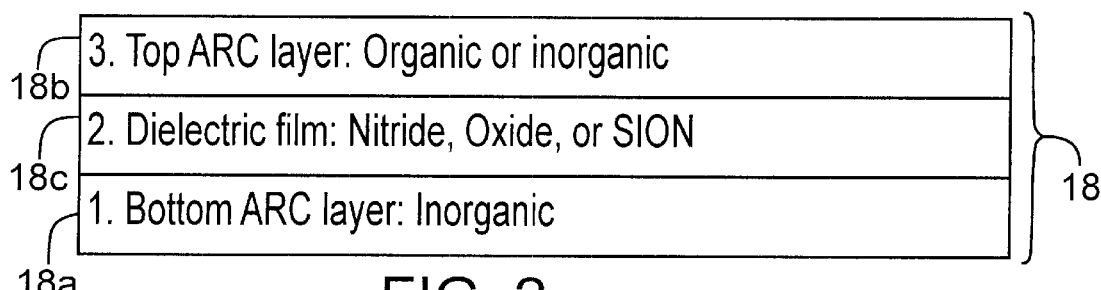
FIG. 2 is a simplified diagram showing a first embodiment of the top layer of the dual-poly gate structure shown in FIG. 1A which top layer comprises a dielectric multi-layer film.

Referring briefly now to FIG. 2, top layer 18 preferably includes three layers, the top and bottom of which are used as photo deep ultraviolet (DUV) or extreme ultraviolet (EUV) anti-reflective coatings (ARCs). The bottom layer 18a preferably is inorganic SiON but not limited to SiON. The top layer 18b may be either organic or inorganic ARC. Depending upon the detailed photo requirements to print sub-quarter-micro pattern, these ARC layers 18a, 18b themselves may be multi-layer films. The sandwiched middle layer 18c is preferably of a material chosen from among nitride, oxide or SiON. After patterning and etching, this layer will serve as a boundary self-alignment hardmask for the subsequent dual-mask polycide etch and as the self-aligned contact (SAC) etch mask later to prevent the metal plug, e.g. of W, Cu, etc., from shorting to the gates.

Those of skill in the art will appreciate that certain requirements are imposed on top layer 18 by lithography (optical qualities). It will also be appreciated that top layer 18 must also meet certain hardmask polycide etch criteria (selectivity and feasibility to etch) and SAC etch criteria (selectivity to interlayer dielectric). Finally, it will be appreciated that certain mechanical properties of the entire film stack 10, e.g. stress, also must be taken into consideration by the lay-up of top layer 18 in order to avoid stress, pattern lifting and other undesirable phenomena.

Figure 1B:
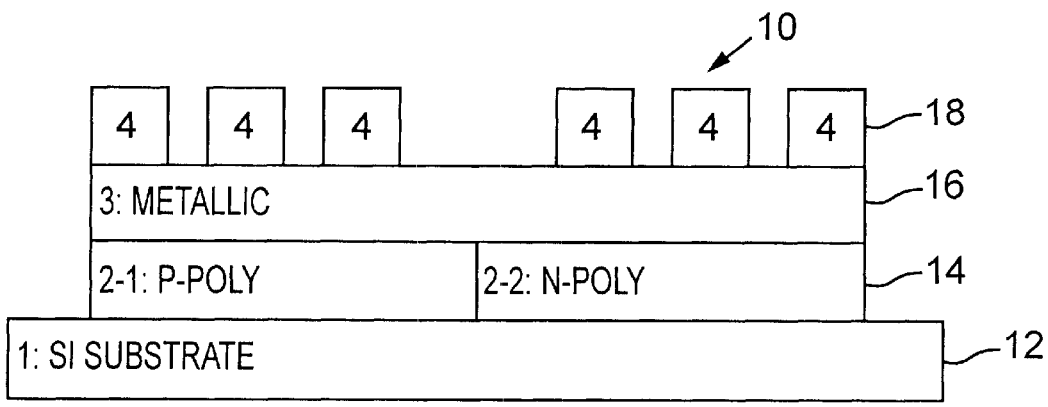

FIG. 1B shows a first step in the gate formation process in which the top multi-layer is patterned and etched. DUV lithography may be used for 0.10–0.25 $\mu$m critical dimension (CD) and EUV lithography may be used for below 0.15 μm CD. During the etching step (the result of which is shown in FIG. 1B by the removal of patterned portions of top layer 18), the loss of the metallic layer (or poly) typically should be less than approximately 100 Å. This ensures endpoint etch reliability during the dual-mask polycide etch step to be described below by reference to FIGS. 1C and 1D. After the etching step is complete, the photo resist (not shown in FIGS. 1A or 1B) is stripped, producing in cross section the structure shown in FIG. 1B.

Figure 1C:
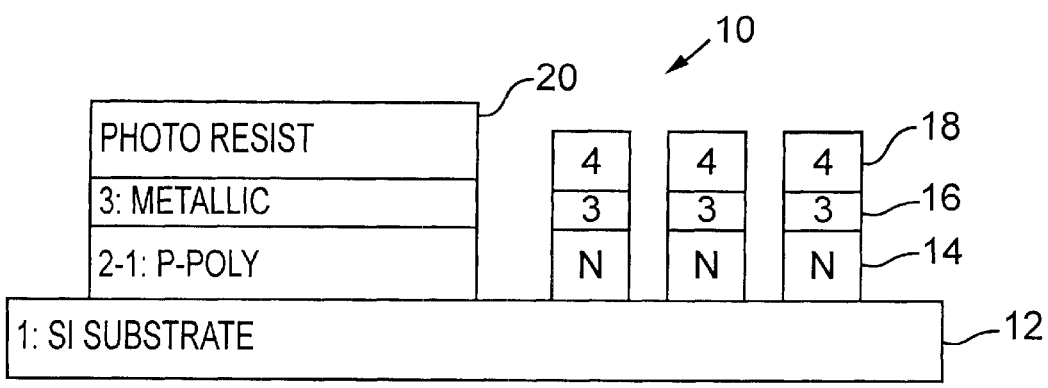

FIG. 1C shows the next gate formation process step in which the N-doped area is etched while the P-doped area is covered by a photo resist 20. Photo resist 20 can be either I-line or DUV resist. The N-doped area is etched with patterned top layer 18 acting as a hardmask. The etch recipe preferably include three steps (two, in the case of the poly-only gate film): one for the metallic layer, one for the poly and one for the over-etch. The metallic layer can be etched by a suitable combination of fluorine-containing gases $CF_4$, $SF_6$, $Cl_2$, HBr, $N_2$ or $O_2$. The same gases may be used to etch poly but with different ratios and/or plasma powers. Both steps are controlled by optical emission endpoints or more advanced predictive endpoints to prevent pitting. All three etch steps require careful etch fine-tuning to ensure straight profiles and to minimize CD micro loading. After the etch steps are complete, the resist is stripped with plasma ash followed by an appropriate cleaning step.

Figure 1D:
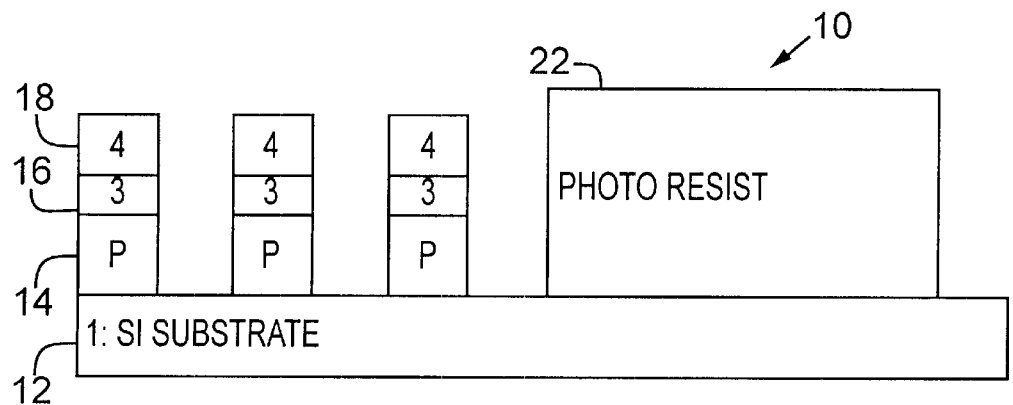

FIG. 1D shows that the above-described etch is repeated for the P-doped area. This time, the N-doped area is protected by a photo resist 22, as illustrated. Since the same dielectric pattern defined in FIG. 1B is used as an etch hardmask for both N-doped and P-doped areas, the N-doped polycide lines and the P-doped polycide lines are self-aligned across the boundary area of the two masks used in the steps illustrated in FIGS. 1C and 1D. However, the two resist masks cannot be overlapped at the boundary area since that would create an un-etched polycide zone along the boundary, as shown in FIGS. 3A through 3C.

Figure 1E:
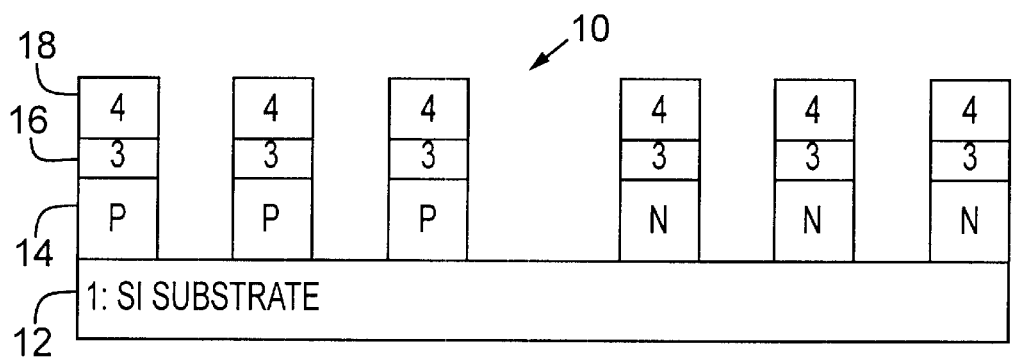

FIG. 1E shows the finished result of the dual-mask process for forming a dual-poly gate film, in which the vertical gate structures of both N-type and P-type are photo resist free after their successive etching using the two different masks. It will be appreciated that, in accordance with the invention, there will be no differential etching of the N-type and P-type devices. This is because two different photo resist masks are used to etch the N-type devices and then the P-type devices. One potential shortcoming of the invented method, however, is that the two masks may ever so slightly overlap, a problem that must be avoided in order to avoid shorts between adjacent circuit lines, as will be described immediately below.

Figure 3A:
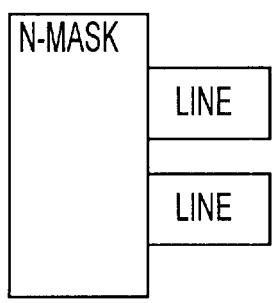
FIGS. 3A through 3C are top plan views of a dual-poly gate illustrating a problem that may attend the use of dual masks in the fabrication thereof.
Figure 3B:
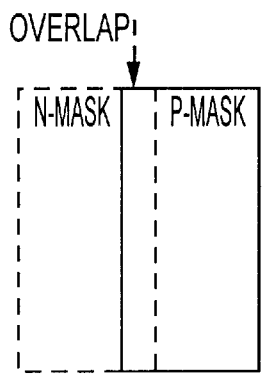
Figure 3C:
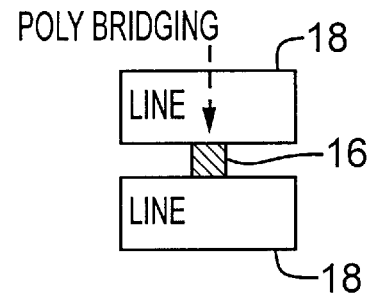

Referring briefly now to FIGS. 3A through 3C, the overlap problem will be described in more detail. FIG. 3A shows a top view of a gate having an N-mask photo resist area and two patterned lines that correspond with different circuit nodes. These lines will be understood to be the upper surface of top layer 18. FIG. 3B shows the overlap that may result from the slightest non-correspondence between the boundaries of the two different masks of type N and type P. FIG. 3C shows an undesirable poly bridge (on metallic layer 16) between the two patterned lines (on top layer 18) that results from the un-etched polycide zone along the overlapping resist masks. The solution to this bridging problem will be described below by reference to FIGS. 4A through 4C.

Figure 4A:
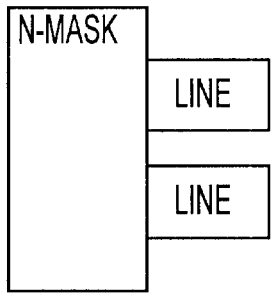
FIGS. 4A through 4C are top plan views of a solution to the problem also in accordance with the invention.
Figure 4B:
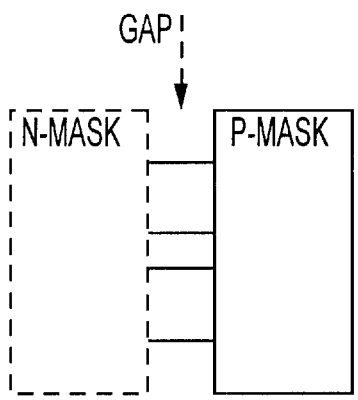
Figure 4C:
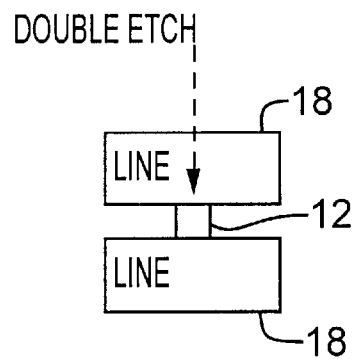

FIGS. 4A through 4C illustrate a solution that, in accordance with the invention, avoids the bridging problem. FIG. 4A corresponds with FIG. 3A and shows an N-mask and two patterned adjacent circuit lines. FIG. 4B, corresponding generally with FIG. 3B, shows an intentional gap that may be formed between the N-Mask and the nominally edge-aligned P-Mask, wherein the gap may be on the order of preferably approximately 0.3–0.5 μm. Such a gap will be understood to avoid possible resist footing and proximity effects at the nominally aligned edges of the resist masks. The effect of the gap is to create a double-etched zone (on substrate 12), as shown in FIG. 4C, between the two patterned lines (on top layer 18). Those of skill in the art will appreciate that the double-etched zone is placed only in the field oxide area to avoid pitting into the active silicon area.

Again, the same chemistries may be used to etch the N-doped and P-doped areas. It will be appreciated, however, that in order to obtain the same device characteristics between the N-doped and P-doped areas of the semiconductor, in terms of profiles, micro loading and oxide remaining, it may be necessary to vary the gas ratios, gas flow rates, plasma powers, etc.

In accordance with an alternative embodiment of the invention, the process steps for fabricating a dual-poly gate differ slightly from those of FIGS. 1A through 1E. In accordance with the alternative embodiment of the invention, the dual-mask technique is used on a non-hardmask dual-poly film stack. The top dielectric multi-layer film is replaced by an ARC film. The rest of the film stack and fabrication technique is similar to that described above by reference to FIGS. 1A through 1E. Again, the ARC film may be either organic or inorganic. The dual-mask etch proceeds as follows.

First, a photo resist mask is applied on a wafer with its P-doped area fully covered by the resist but with its N-doped area covered by a resist circuitry pattern. In the exposed N-doped area, the ARC layer, the metallic layer (there is of course no metallic layer for poly-only dual-gate film) and the N-doped poly are etched in-situ with one etch recipe. After etching, the resist is stripped. Next, the same etch is repeated for the P-doped area. To obtain the same etch performance between the N-doped and the P-doped areas, the etch recipes are different.

CONCLUSION

Contrasted with the conventional single-mask etch technique, the major advantage of the invented dual-mask etch process is that etch recipes can be separately tuned to achieve the same etch characteristics for N-doped and P-doped semiconductor devices. A difficulty is in boundary matching between the N and P masks. Nevertheless, the pre-defined nitride hardmask poly line connection at the boundary is self-aligned. Thus, to avoid poly bridging a double-etched gap (etched twice: once during N etching and again during P etching) is created at the nominally aligned mask boundary. By design, no active area will be exposed at the gap to avoid pitting into Si that would cause device failure. For the non-hardmask dual-mask etch, mask matching at the boundary is somewhat more difficult. But with careful design consideration this problem too can be solved, within the spirit and scope of the invention.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A complementary metal-oxide semiconductor (CMOS) dual-gate semiconductor fabrication method comprising:

providing a polysilicon layer of a first type over a first region of a semiconductor substrate;

providing a polysilicon layer of a second type over a second region of the semiconductor substrate;

depositing a metallic layer overlying the polysilicon layers in the first and second regions;

depositing an anti-reflective layer overlying the metallic layer in the first and second regions;

selectively etching the anti-reflective layer;

forming a first photoresist pattern overlying the anti-reflective layer in the first region;

first etching the metallic layer and the polysilicon layer of the second type to form a stacked gate structure in the second region;

forming a second photoresist pattern overlying the anti-reflective layer in the second region; and second etching the metallic layer and the polysilicon layer of the first type to form a stacked gate structure in the first region.

2. The method of claim 1 wherein the first photoresist mask and the second photoresist mask define a boundary therebetween, the masks having substantially no overlap at the boundary.

3. The method of claim 1 wherein the first photoresist pattern and the second photoresist pattern define a boundary therebetween, the patterns having a gap therebetween in a region around the boundary.

4. The method of claim 3 in which the patterns have a gap therebetween of approximately 0.3 to 0.5 microns.

5. The method of claim 1 wherein said first etching and said second etching are performed with different etch recipes.

6. The method of claim 5 wherein said first etching and said second etching are performed by plasma etching and wherein the different etch recipes include variations in gas ratios, gas flow rates or plasma powers, or a combination thereof.

7. The method of claim 1 wherein the anti-reflective layer comprises an upper and a lower anti-reflective coating (ARC) layers with a dielectric film therebetween.

8. The method of claim 7 wherein the lower ARC layer is inorganic and the upper ARC layer is organic or inorganic.

9. The method of claim 8 wherein the dielectric film between the upper and lower ARC layers comprises nitride, oxide or SiON, or a combination thereof.

10. The method of claim 9 wherein the semiconductor substrate comprises silicon.

11. A complementary metal-oxide semiconductor (CMOS) dual-gate semiconductor fabrication method comprising:

providing a polysilicon layer of a first type over a first region of a semiconductor substrate;

providing a polysilicon layer of a second type over a second region of the semiconductor substrate;

depositing a metallic layer overlying the polysilicon layers over the first and second regions;

depositing an anti-reflective coating (ARC) layer overlying the metallic layer over the first and second regions;

forming a first photoresist mask pattern overlying the ARC layer, the first pattern masking all of the first region and selectively pattern masking the second region;

first selectively etching the ARC layer, the metallic layer and the polysilicon layer of the second type to produce a stacked gate structure in the second region;

forming a second photoresist mask pattern overlying the ARC layer, the second pattern masking all of the second region and selectively pattern masking the first region;

second selectively etching the ARC layer, the metallic layer and the polysilicon layer of the first type to form a stacked gate structure in the first region.

12. The method of claim 11 wherein the first photoresist mask pattern and the second photoresist mask pattern define a boundary therebetween, the mask patterns having substantially no overlap at the boundary.

13. The method of claim 11 wherein the first photoresist mask pattern and the second photoresist mask pattern define a boundary therebetween, the mask patterns having a gap therebetween in a region around the boundary.

14. The method of claim 13 in which the patterns have a gap therebetween of approximately 0.3 to 0.5 microns.

15. The method of claim 11 wherein said first selective etching and said second selective etching are performed with different etch recipes.

16. The method of claim 15 wherein said first selective etching and said second selective etching are performed by plasma etching and wherein the different etch recipes include variations in gas ratios, gas flow rates, plasma powers or a combination thereof.

17. A complementary metal-oxide semiconductor (CMOS) dual-gate semiconductor fabrication method comprising:

providing a polysilicon layer of a first type over a first region of a semiconductor substrate;

providing a polysilicon layer of a second type over a second region of the semiconductor substrate;

depositing a metallic layer overlying the polysilicon layers over the first and second regions;

depositing an anti-reflective coating-based (ARC-based) layer overlying the metallic layer over the first and second regions;

first selectively etching the ARC-based layer, the metallic layer and the polysilicon layers in the first region using a first pattern to produce a stacked gate structure in the first region; and second selectively etching the ARC-based layer, the metallic layer and the polysilicon layers in the second region using a second pattern to form a stacked gate structure in the second region.

18. The method of claim 17 wherein a first photoresist pattern and a second photoresist pattern define a boundary therebetween, the patterns having substantially no overlap at the boundary.

19. The method of claim 17 wherein the first pattern and the second pattern define a boundary therebetween, the patterns having a gap therebetween in a region around the boundary.

20. The method of claim 19 in which the patterns have a gap therebetween of approximately 0.3 to 0.5 microns.

21. The method of claim 17 wherein said first selective etching and said second selective etching are performed with different etch recipes.

22. The method of claim 21 wherein said first selective etching and said second selective etching are performed by plasma etching and wherein the different etch recipes include variations in gas ratios, gas flow rates or plasma powers, or a combination thereof.

23. A complementary metal-oxide semiconductor (CMOS) dual-gate semiconductor fabrication method comprising:
  providing a polysilicon layer of a first type over a first region of a semiconductor substrate;
  providing a polysilicon layer of a second type over a second region of the semiconductor substrate;
  depositing a metallic layer overlying the polysilicon layers in the first and second regions;
  depositing an anti-reflective layer;
  selectively etching the anti-reflective layer;
  forming a first photoresist pattern overlying the anti-reflector layer in the first region,
  first etching the metallic layer and the polysilicon layer of the second type to form a stacked gate structure in the second region;
  forming a second photoresist pattern overlying the anti-reflective layer in the second region;
  wherein the first photoresist mask and the second photoresist mask define a boundary therebetween, the marks having substantially no overlap at the boundary; and
  second etching the metallic layer and the polysilicon layer of the first type to form a stacked gate structure in the first region.

24. A complementary metal-oxide semiconductor (CMOS) dual-gate semiconductor fabrication method comprising:
  providing a polysilicon layer of a first type over a first region of a semiconductor substrate;
  providing a polysilicon layer of a second type over a second region of the semiconductor substrate;
  depositing a metallic layer overlying the polysilicon layers in the first and second regions;
  depositing an anti-reflective layer overlying the metallic layer in the first and second regions;
  selectively etching the anti-reflective layer;
  forming a first photoresist pattern overlying the anti-reflective layer in the first region,
  first etching the metallic layer and the polysilicon layer of the second type to form a stacked gate structure in the second region;
  forming a second photoresist pattern overlying the anti-reflective layer in the second region,
  wherein the first photoresist pattern and the second photoresist pattern define a boundary therebetween, the patterns having a gap therebetween in a region around the boundary; and
  second etching the metallic layer and the polysilicon layer of the first type to form a stacked gate structure in the first region.

25. The method of claim 24 wherein the patterns have a gap therebetween of approximately 0.3 to 0.5 microns.

26. A complementary metal-oxide semiconductor (CMOS) dual-gate semiconductor fabrication method comprising:
  providing a polysilicon layer of a first type over a first region of a semiconductor substrate;
  providing a polysilicon layer of a second type over a second region of the semiconductor substrate;
  depositing a metallic layer overlying the polysilicon layers over the first and second regions;
  depositing an anti-reflective coating (ARC) layer overlying the metallic layer over the first and second regions;
  forming a first photoresist mask pattern overlying the ARC layer, the first pattern masking all of the first region and selectively pattern masking the second region;
  first selectively etching the ARC layer, the metallic layer and the polysilicon layer of the second type to produce a stacked gate structure in the second region;
  forming a second photoresist mask pattern overlying the ARC layer, the second pattern masking all of the second region and selectively pattern masking the first region;
  wherein the first photoresist mask pattern and the second photoresist mask pattern define a boundary therebetween, the mask patterns having substantially no overlap at the boundary; and
  second selectively etching the ARC layer, the metallic layer and the polysilicon layer of the first type to form a stacked gate structure in the first region.

27. A complementary metal-oxide semiconductor (CMOS) dual-gate semiconductor fabrication method comprising:
  providing a polysilicon layer of a first type over a first region of a semiconductor substrate;
  providing a polysilicon layer of a second type over a second region of the semiconductor substrate;
  depositing a metallic layer overlying the polysilicon layers over the first and second regions;
  depositing an anti-reflective coating (ARC) layer overlying the metallic layer over the first and second regions;
  forming a first photoresist mask pattern overlying the ARC layer, the first pattern masking all of the first region and selectively pattern masking the second region;
  first selectively etching the ARC layer, the metallic layer and the polysilicon layer of the second type to produce a stacked gate structure in the second region;
  forming a second photoresist mask pattern overlying the ARC layer, the second pattern masking all of the second region and selectively pattern masking the first region,
  wherein the first photoresist mask pattern and the second photoresist mask pattern define a boundary therebetween, the mask patterns having a gap therebetween in a region around the boundary; and
  second selectively etching the ARC layer, the metallic layer and the polysilicon layer of the first type to form a stacked gate structure in the first region.

28. The method of claim 27 wherein the patterns have a gap therebetween of approximately 0.3 to 0.5 microns.

29. A complementary metal-oxide semiconductor (CMOS) dual-gate semiconductor fabrication method comprising:
  providing a polysilicon layer of a first type over a first region of a semiconductor substrate;
  providing a polysilicon layer of a second type over a second region of the semiconductor substrate;
  depositing a metallic layer overlying the polysilicon layers over the first and second regions;
  depositing an anti-reflective coating-based (ARC-based) layer overlying the metallic layer over the first and second regions;
  first selectively etching the ARC-based layer, the metallic layer and the polysilicon layers in the first region using a first photoresist pattern to produce a stacked gate structure in the first region;

second selectively etching the ARC-based layer, the metallic layer and the polysilicon layers in the second region using a second photoresist pattern to form a stacked gate structure in the second region; and wherein the first photoresist pattern and the second photoresist pattern define a boundary therebetween, the patterns having substantially no overlap at the boundary.

30. The method of claim 29 wherein the patterns have a gap therebetween of approximately 0.3 to 0.5 microns.

31. A complementary metal-oxide semiconductor (CMOS) dual-gate semiconductor fabrication method comprising:

providing a polysilicon layer of a first type over a first region of a semiconductor substrate;

providing a polysilicon layer of a second type over a second region of the semiconductor substrate;

depositing a metallic layer overlying the polysilicon layers over the first and second regions;

depositing an anti-reflective coating-based (ARC-based) layer overlying the metallic layer over the first and second regions;

first selectively etching the ARC-based layer, the metallic layer and the polysilicon layers in the first region using a first pattern to produce a stacked gate structure in the first region;

second selectively etching the ARC-based layer, the metallic layer and the polysilicon layers in the second region using a second pattern to form a stacked gate structure in the second region; and wherein the first pattern and the second pattern define a boundary therebetween, the patterns having a gap therebetween in a region around the boundary.

* * * * *